US006893956B2

(12) United States Patent
Ruelke et al.

(10) Patent No.: US 6,893,956 B2
(45) Date of Patent: May 17, 2005

(54) BARRIER LAYER FOR A COPPER METALLIZATION LAYER INCLUDING A LOW-K DIELECTRIC

(75) Inventors: Hartmut Ruelke, Dresden (DE); Joerg Hohage, Dresden (DE); Thomas Werner, Dresden (DE); Massud Aminpur, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/403,483

(22) Filed: Mar. 31, 2003

(65) Prior Publication Data

US 2004/0084680 A1 May 6, 2004

(30) Foreign Application Priority Data

Oct. 31, 2002 (DE) ................................. 102 50 889

(51) Int. Cl.[7] ........................................ H01L 21/4763
(52) U.S. Cl. ................... 438/627; 438/643; 438/653; 438/763; 438/775
(58) Field of Search ........................... 438/622, 624, 438/627, 634, 643, 653, 763, 775

(56) References Cited

U.S. PATENT DOCUMENTS

| 6,306,758 | B1 | 10/2001 | Park ........................... 438/636 |
| 6,387,775 | B1 | 5/2002 | Jang et al. ................... 438/396 |
| 6,444,568 | B1 | 9/2002 | Sundararajan et al. ...... 438/627 |
| 6,455,417 | B1 | 9/2002 | Bao et al. .................... 438/637 |
| 6,657,284 | B1 * | 12/2003 | Li et al. ...................... 257/649 |
| 6,690,035 | B1 * | 2/2004 | Yokogawa et al. ............ 257/77 |
| 2001/0003064 | A1 | 6/2001 | Ohto ........................... 438/687 |
| 2001/0019175 | A1 | 9/2001 | Smith et al. ................. 257/774 |
| 2002/0016085 | A1 * | 2/2002 | Huang et al. ................ 438/798 |
| 2002/0084257 | A1 | 7/2002 | Bjorkman et al. ............. 216/72 |
| 2002/0119250 | A1 | 8/2002 | Campana et al. ....... 427/255.28 |
| 2003/0003765 | A1 | 1/2003 | Gibson, Jr. et al. ......... 438/760 |
| 2003/0102491 | A1 | 6/2003 | Yang et al. .................. 257/200 |
| 2003/0134495 | A1 * | 7/2003 | Gates et al. ................. 438/600 |
| 2003/0176080 | A1 * | 9/2003 | Fu et al. ..................... 438/778 |

FOREIGN PATENT DOCUMENTS

| EP | 1 172 845 A2 | 1/2002 | ....... H01L/21/3105 |
| EP | 1 172 846 A2 | 1/2002 | ......... H01L/21/316 |
| EP | 1 284 500 A2 | 2/2003 | ......... H01L/21/768 |
| GB | 2 365 216 A | 2/2002 | ......... H01L/21/314 |
| WO | WO 02/23625 A2 | 3/2002 | ......... H01L/21/768 |

* cited by examiner

Primary Examiner—Hsien-Ming Lee
(74) Attorney, Agent, or Firm—Williams, Morgan & Amerson, P.C.

(57) ABSTRACT

The effect of resist poisoning may be eliminated or at least substantially reduced in the formation of a low-k metallization layer, in that a nitrogen-containing barrier/etch stop layer is provided with a significantly reduced nitrogen concentration at an interface in contact with said low-k dielectric material. Consequently, diffusion of nitrogen and nitrogen compounds in vias formed in said low-k dielectric layer is significantly suppressed, so that in a subsequent photolithographic step, interaction of nitrogen and nitrogen compounds with the photoresist is remarkably reduced.

41 Claims, 5 Drawing Sheets

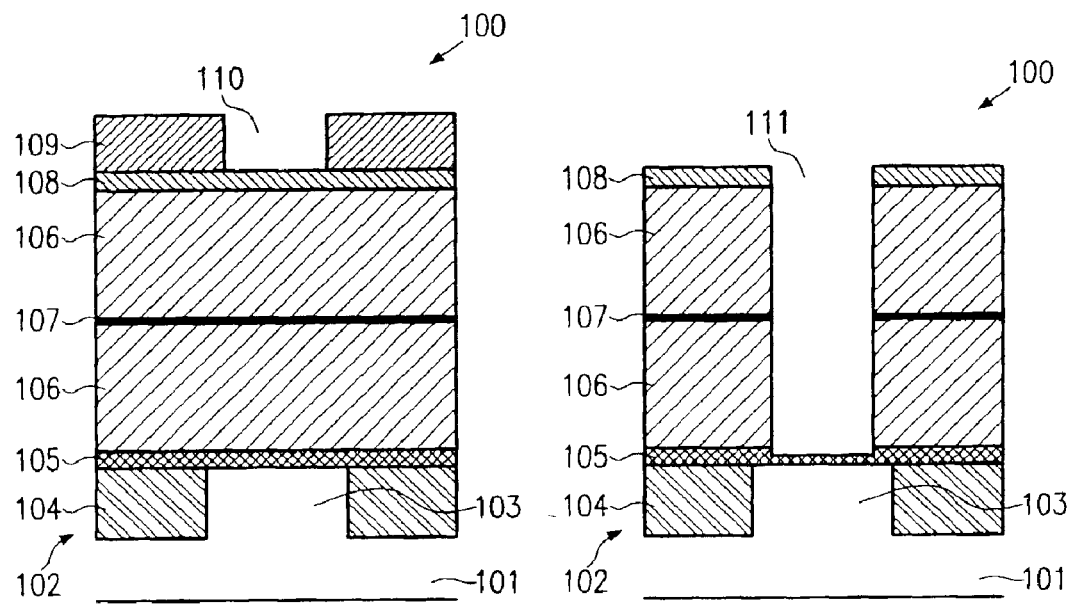
FIG.1a (prior art)
FIG.1b (prior art)
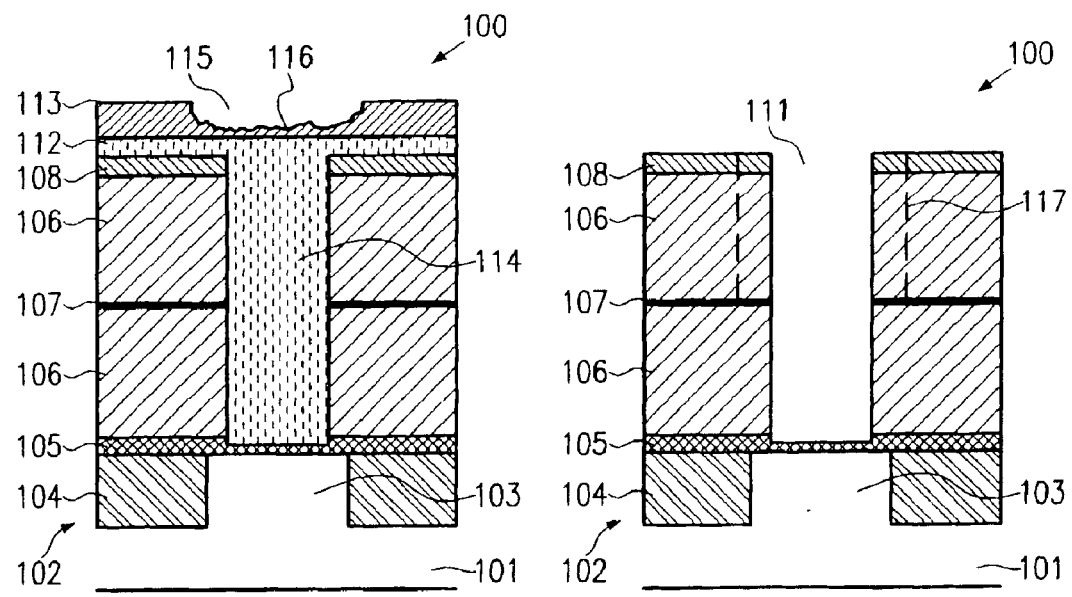
FIG.1c (prior art)
FIG.1d (prior art)

BARRIER LAYER FOR A COPPER METALLIZATION LAYER INCLUDING A LOW-K DIELECTRIC

BACKGROUND OF THE INVENTION

1. Field of the Invention

Generally, the present invention relates to the formation of integrated circuits, and, more particularly, to the formation of metallization layers including highly conductive metals, such as copper, embedded into a dielectric material having low permittivity to enhance device performance.

2. Description of the Related Art

In modern integrated circuits, minimum feature sizes, such as the channel length of field effect transistors, have reached the deep sub-micron range, thereby steadily increasing performance of these circuits in terms of speed and power consumption. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines have to be reduced to compensate for a reduced amount of available floor space and for an increased number of circuit elements provided per chip. In integrated circuits having minimum dimensions of approximately 0.35 $\mu$m and less, a limiting factor of device performance is the signal propagation delay caused by the switching speed of the transistor elements. As the channel length of these transistor elements has now reached 0.18 $\mu$m and less, it turns out, however, that the signal propagation delay is no longer limited by the field effect transistors, but is limited, owing to the increased circuit density, by the close proximity of the interconnect lines, since the line-to-line capacitance is increased in combination with a reduced conductivity of the lines due to their reduced cross-sectional area. The parasitic RC time constants, therefore, require the introduction of a new type of materials for forming the metallization layer.

Traditionally, metallization layers are formed by a dielectric layer stack including, for example, silicon dioxide and/or silicon nitride with aluminum as the typical metal. Since aluminum exhibits significant electromigration at higher current densities than may be necessary in integrated circuits having extremely scaled feature sizes, aluminum is being replaced by copper, which has a significantly lower electrical resistance and a higher resistivity against electromigration. For devices having feature sizes of 0.13 $\mu$m and less, it turns out that simply replacing aluminum with copper does not provide the required decrease of the parasitic RC time constants, and, therefore, the well-established and well-known dielectric materials, silicon dioxide (k approximately 4.2) and silicon nitride (k>5), are increasingly replaced by so-called low-k dielectric materials. However, the transition from the well-known and well-established aluminum/silicon dioxide metallization layer to a low-k dielectric/copper metallization layer is associated with a plurality of issues to be dealt with.

For example, copper may not be deposited in higher amounts in an efficient manner by well-established deposition methods, such as chemical and physical vapor deposition. Moreover, copper may not be efficiently patterned by well-established anisotropic etch processes; therefore, the so-called damascene technique is employed in forming metallization layers including copper lines. Typically, in the damascene technique, the dielectric layer is deposited and then patterned with trenches and vias that are subsequently filled with copper by plating methods, such as electroplating or electroless plating. Although the damascene technique is presently a well-established technique for forming copper metallization layers in standard dielectric materials, such as silicon dioxide, the employment of low-k dielectrics requires the development of new dielectric diffusion barrier layers so as to avoid copper contamination of adjacent material layers, as copper readily diffuses in a plurality of dielectrics. Although silicon nitride is known as an effective copper diffusion barrier, silicon nitride may not be considered appropriate in low-k dielectric layer stacks owing to its high permittivity. Therefore, silicon carbide is presently considered as a viable candidate for a copper diffusion barrier. It turns out, however, that copper's resistance against electromigration strongly depends on the interface between the copper and the adjacent diffusion barrier layer, and, therefore, in sophisticated integrated circuits featuring high current densities, it is generally preferable to use up to 20% nitrogen in the silicon carbide layer, thereby remarkably improving the electromigration behavior of copper compared to pure silicon carbide.

A further problem in forming low-k copper metallization layers has been under-estimated in the past and is now considered a major challenge in the integration of low-k dielectrics. During the patterning of the low-k dielectric material, standard photolithography is used to image the required structure into the deep UV photoresist. In developing the photoresist, certain portions of the resist which have been exposed may not be completely removed as required and thus the structure may not be correctly transferred into the underlying low-k dielectric material. The effect of insufficiently developing the photoresist is also referred to as resist poisoning. With reference to FIGS. 1a–1e, a typical conventional process flow will now be described to explain the problems involved in forming a metallization layer including copper and a low-k dielectric in more detail.

FIG. 1a schematically shows a cross-sectional view of a semiconductor structure 100, in which a low-k dielectric material is to be patterned in accordance with a so-called via first/trench last process sequence, which is presently considered the most promising process scheme in patterning low-k dielectrics. The semiconductor structure 100 comprises a substrate 101 that may include circuit elements, such as transistors, resistors, capacitors and the like, and which may include a lower metallization layer 102 including a metal region 103 embedded in a dielectric material 104. Depending on the level of the lower metallization layer 102, the metal region 103 may comprise copper and the dielectric 104 may be a low-k dielectric, such as hydrogen-containing silicon oxycarbide (SiCOH). A barrier layer 105 is formed of nitrogen containing silicon carbide (SiCN) which also serves as an etch stop layer in the following etch procedure for patterning an overlying low-k dielectric layer 106. The low-k dielectric layer 106 may comprise, depending on the process sequence used, an intermediate silicon carbide etch stop layer 107, which in many applications may, however, be omitted for the benefit of a reduced total permittivity. The low-k dielectric material in the layer 106 may comprise SiCOH. A cap layer 108, for example comprised of oxide or provided as an anti-reflective coating (ARC), may optionally be located on the low-k dielectric layer 106 and may then serve as a stop layer in removing excess copper in a subsequent chemical mechanical polishing (CMP) process. A resist mask 109 including an opening 110 is formed above the optional cap layer 108.

A typical process flow for forming the semiconductor structure 100, as shown in FIG. 1a, may comprise the following steps. After planarizing the lower metallization layer 102, the barrier/etch stop layer 105 is deposited by, for example, a plasma enhanced chemical vapor deposition (PECVD) from trimethyl silane (3MS) and ammonia (NH$_3$) as precursor gases. Then, the hydrogen-containing silicon oxycarbide is deposited, wherein, if required, the silicon carbide layer 107 is formed when a first required thickness of the dielectric layer 106 is obtained. Thereafter, the residual layer 106 is deposited to achieve the required overall thickness of the layer 106. Next, the cap layer 108, if required, is deposited with a required thickness. The cap layer 108 may help to substantially avoid any interaction of the low-k dielectric of the layer 106 with the overlying resist mask 109 and may serve as a CMP stop layer. Then the resist mask 109 is patterned in accordance with well-established deep UV lithography techniques to form the opening 110 determining the dimensions of the vias to be formed within the dielectric layer 106.

FIG. 1b schematically shows the semiconductor structure 100 after an anisotropic etch process for forming a via 111 in the cap layer 108 and the dielectric layer 106. During the anisotropic etch procedure, the barrier/etch stop layer 105 exhibits a significantly lower etch rate than the surrounding dielectric layer 106, so that the etch process may be stopped in or on the layer 105. Thereafter, the remaining photoresist not consumed during the anisotropic etch process is removed by an etch step in an oxygen-containing plasma ambient. It should be noted that, in particular, the nitrogen contained in the barrier/etch stop layer 105 may readily diffuse into the low-k dielectric of the layer 106 due to the desired porosity of this material. Since the cap layer 108 substantially prevents any diffusion from nitrogen or nitrogen-containing compounds into the overlying resist mask 109, the patterning of the opening 110 and the subsequent patterning of the via 111 is substantially not affected by any resist poisoning effects.

FIG. 1c schematically shows the semiconductor structure 100 in an advanced manufacturing stage. The via 111 is filled with an organic anti-reflective coating material so as to include a via plug 114, whereas the organic material is provided at the remaining surface of the structure 100 so as to form an anti-reflective coating layer 112 for the subsequent photolithography. Thus, the plug 114 and the anti-reflective coating 112 serve to planarize the topography of the semiconductor structure 100 prior to the formation of a further photoresist mask 113. As shown, the photoresist mask 113 includes a trench opening 115 at the bottom of which resist residuals 116 are maintained.

The via plug 114 and the anti-reflective coating 112 may be formed by spin-on techniques and the like, and the photoresist mask 113 may be formed by sophisticated lithography methods, as are well known in the art. Contrary to the formation of the resist mask 109, nitrogen or nitrogen compounds may readily diffuse in the organic anti-reflective coating material and may now come into contact with the overlying photoresist 113, since the protecting cap layer 108 is open at the via 111. The interaction of nitrogen and compounds thereof with the photoresist may deteriorate the light sensitivity of the resist. Consequently, upon exposure and development of the photoresist 113 in forming the trench opening 115, the resist residuals 116 remain and significantly affect the following anisotropic etch step for forming a trench in the upper portion of the dielectric layer 106.

FIG. 1d schematically shows the semiconductor structure 100 after completion of the trench forming step. As is evident from FIG. 1d, the trench 117 that should have been formed in the dielectric layer 106 is substantially not transferred from the photoresist mask 113 to the underlying cap layer 108 and the upper portion of the dielectric layer 106. Thus, after removing the remaining photoresist mask 113, the cap layer 108 and the dielectric layer 106 comprise substantially the via 111 without any trench in the upper portion of the layer 106. It should be noted that a so-called bi-layer is commonly used for the photoresist mask 113, wherein a lower portion of the bi-layer may comprise silicon so as to reduce the interaction of the photoresist with up-diffusing nitrogen and nitrogen compounds. It turns out, however, that even the provision of a photoresist bi-layer is insufficient in preventing resist poisoning. Moreover, even a significant increase of the thickness of the anti-reflective coating 112 may not efficiently prevent the overlying photoresist layer 113 from interacting with up-diffusing nitrogen-containing compounds.

FIG. 1e schematically shows the semiconductor structure 100 after completion of the metallization layer 130, including a barrier metal layer 118 on inner sidewalls and the bottom of the via 111, which is filled with copper 119. Moreover, a surface 120 of the metallization layer 130 is planarized to allow the formation of a further metallization layer.

Typically, the barrier metal layer 118 may be deposited by physical vapor deposition, such as sputter deposition, with a thickness that insures sufficient protection against copper out-diffusion and at the same time provides a required adhesion to the surrounding low-k dielectric material. Typically, tantalum or tantalum nitride may be used as the material for the barrier metal layer 118. Subsequently, a copper seed layer is deposited to promote the subsequent deposition of the bulk copper by electroplating. Then, the excess copper is removed by chemical mechanical polishing, wherein the cap layer 108 is also removed and acts as a stop layer to reliably control the CMP process. However, since the trenches 117 required for the electrical connection are missing, as shown in FIGS. 1d and 1e, or are at least substantially reduced in size, device failures consequently occur or at least a significantly reduced device reliability is obtained. Moreover, since electromigration of copper strongly depends on the characteristics of the interface to the surrounding material, it is important to maintain a required nitrogen concentration within the layer 105, especially at regions 121, in which the copper of the metal region 103 is in contact with the barrier/etch stop layer 105, so as to obtain the required electromigration behavior, an improved adhesion, and the like, compared to pure silicon carbide layers.

In view of the above problems, it is thus highly desirable to provide a technique that allows maintaining superior barrier characteristics without unduly promoting resist poisoning in the formation of low-k metallization layers.

SUMMARY OF THE INVENTION

Generally, the present invention is directed to a semiconductor device and a method that provides the required nitrogen concentration at a lower portion of a dielectric barrier/etch stop layer so as to provide for the advantageous electromigration behavior of an adjacent copper material, while an upper portion of the barrier/etch stop layer has a significantly reduced nitrogen concentration, wherein in some embodiments an upper surface of the etch stop layer may be substantially completely depleted from nitrogen.

According to one illustrative embodiment of the present invention, a semiconductor structure comprises a low-k dielectric layer and a metal-containing region that is at least partially formed in the low-k dielectric layer. Moreover, a nitrogen-containing dielectric barrier layer having a first surface in contact with the low-k dielectric layer and a second surface partially in contact with the metal-containing region is provided, wherein a nitrogen concentration at the first surface is less than a nitrogen concentration at the second surface.

In a further illustrative embodiment of the present invention, a metallization structure of an integrated circuit comprises a first metallization layer and a second metallization layer formed over the first metallization layer and including a low-k dielectric material. A dielectric barrier layer containing nitrogen and located between the first and the second metallization layers is provided, wherein the dielectric barrier layer has a first interface in contact with the first metallization layer, and a second interface in contact with the second metallization layer, whereby a concentration of nitrogen decreases from the first interface towards the second interface.

In accordance with still another illustrative embodiment of the present invention, a method of forming a metallization layer comprises depositing a low-k barrier layer over a substrate having formed thereon a metal region. During deposition of the low-k barrier layer, an incorporation of a diffusion barrier component into the low-k barrier layer is controlled such that a concentration of the diffusion barrier component is highest at a first surface of the low-k barrier layer, which faces the metal region, and is lowest at the second surface opposite to the first surface. Moreover, a low-k dielectric layer is deposited over the low-k barrier layer wherein a diffusion of the diffusion barrier component through the second surface is reduced.

According to still a further illustrative embodiment of the present invention, a method of forming a low-k dielectric barrier layer over a metal region in a metallization structure comprises the deposition of a nitrogen-containing silicon carbide layer from silicon, carbon and nitrogen-containing precursor gases over a substrate having formed thereon the metal region. The feeding of the nitrogen-containing precursor gas is then discontinued to reduce the nitrogen concentration while depositing silicon carbide.

In still another illustrative embodiment of the present invention, a method of forming a low-k dielectric barrier layer over a metal region in a metallization structure comprises depositing a first silicon carbide layer from silicon and carbon-containing precursor gases. Then, a nitrogen-containing plasma ambient is established to introduce nitrogen into the first silicon carbide layer. Thereafter, a second silicon carbide layer is deposited on the first silicon carbide layer.

BRIEF DESCRIPTION OF THE DRAWINGS

The invention may be understood by reference to the following description taken in conjunction with the accompanying drawings, in which like reference numerals identify like elements, and in which:

FIGS. 1a–1e schematically show cross-sectional views of a semiconductor structure including a low-k metallization layer, wherein trenches in the low-k dielectric are substantially not formed owing to resist poisoning in the dual damascene process;

Figure 1E:
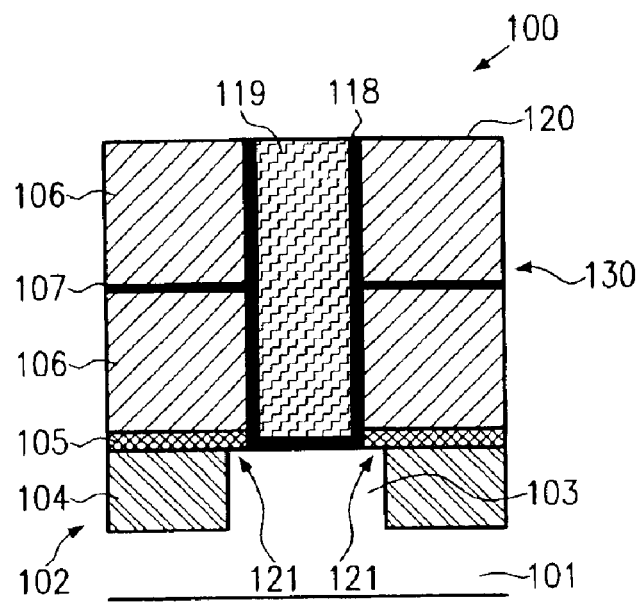

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on investigations the inventors have performed in order to clarify the reasons for resist poisoning in a typical dual damascene process sequence. The inventors confirmed that a reaction of amine species, that is, nitrogen hydrogen compounds (N—H*), created by diffusion of nitrogen into the overlying low-k dielectric, interact with the low-k dielectric and upon up-diffusion with the photoresist, even if provided as a bi-layer. The interaction of the nitrogen-containing compounds with the photoresist then leads to undeveloped resist residuals in the trench resist mask in a via first/trench last process. Therefore, the nitrogen in the barrier/etch stop layer is substantially confined to a region of the barrier/etch stop layer being in contact with underlying copper, thereby maintaining the superior barrier and adhesion characteristics, whereas an interface of the barrier/etch stop layer with the overlying low-k dielectric contains a minimum nitrogen concentration or is even substantially completely free of nitrogen.

Figure 2A:
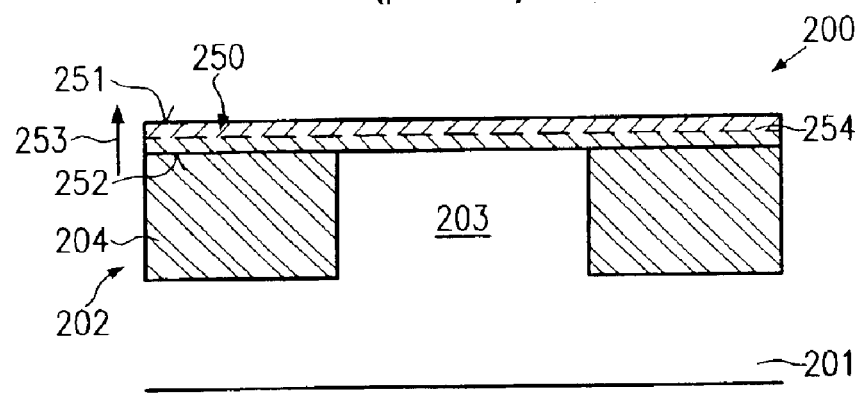
FIG. 2a schematically shows a semiconductor structure including a dielectric barrier/etch stop layer in accordance with one illustrative embodiment of the present invention.

With reference to FIGS. 2a–2j, illustrative embodiments of the present invention will now be described. In FIG. 2a, a semiconductor structure 200 comprises a substrate 201 over which a first metallization layer 202 is formed. As already explained with reference to FIGS. 1a–1e, the substrate 201 may include many circuit elements, such as transistors, resistors, capacitors and the like, wherein the first metallization layer 202 provides electrical contact to at least some of the circuit elements. The first metallization layer 202 may represent the very first metallization layer or may represent any intermediate metallization layer over which one or more additional metallization layers are to be formed. The first metallization layer 202 may include a first dielectric layer 204 with a first metal region 203 contained therein. In the present example, the first metal region 203 may be comprised of copper including a barrier diffusion layer provided between the dielectric material 204 and the copper of the first metal region 203. A barrier/etch stop layer 250 has a first surface 251 and a second surface 252 in contact with the first metallization layer 202. In one particular embodiment, the barrier/etch stop layer 250 is comprised of silicon carbide that contains nitrogen, the concentration of which varies along a depth 253 of the layer 250. In one embodiment, the nitrogen concentration is highest at the surface 252 with a concentration of approximately 15–30% with respect to the silicon carbide, and then gradually, or step-wise, decreases in the direction 253, wherein a nitrogen concentration at the first surface 251 is significantly reduced and is less than approximately 1% or, in other embodiments, even less than approximately 0.1%.

Figure 2B:
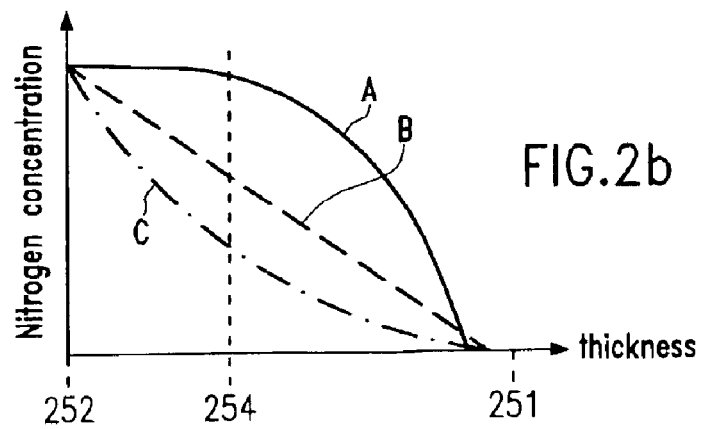
FIG. 2b shows a diagram illustrating a nitrogen concentration in the barrier/etch stop layer of FIG. 2a according to representative examples of the present invention.

FIG. 2b schematically shows a graph illustrating the nitrogen concentration along the depth direction 253 for various examples in accordance with the present invention. Curve A represents the progression of the nitrogen concentration starting at approximately 20% at the second surface 252 and maintaining a relatively high level up to an intermediate thickness 254. The nitrogen concentration then rapidly drops to an insignificant amount before the first surface 251. Curve B represents a gradual decrease of the nitrogen concentration, again starting at approximately 20%, with a substantially linear drop of the concentration to an amount of approximately 0.1% in the vicinity of the first surface 251. Curve C represents a nitrogen concentration exhibiting a more rapid decrease in the first portion of the barrier/etch stop layer 250 so that a substantially lower nitrogen amount is prevailing in the upper portion of the layer 250 compared to curves A and B. It should be noted, however, that the progression of the nitrogen concentration may be adjusted according to a plurality of different profiles, as are considered appropriate for the specific application.

A typical process flow for manufacturing the semiconductor structure 200, as shown in FIG. 2a, with the barrier/etch stop layer 250 having a varying concentration of a diffusion barrier component, such as nitrogen, may include the following steps. First, the substrate 201 may be provided having already formed thereon the first metallization layer 202. The formation of the first metallization layer 202 may comprise substantially the same steps as used for the formation of a subsequent metallization layer, as will be described in more detail later in this application and thus description thereof will be omitted here. Thereafter, the barrier/etch stop layer 250 is deposited by, for example, plasma-enhanced CVD with a required thickness, for example, in the range of approximately 10–100 nm. During deposition, the amount of a nitrogen-containing precursor gas may be controlled so as to obtain a varying nitrogen concentration in the deposition ambient and, thus, in the deposited layer 250, as is for example shown in FIG. 2b.

In one embodiment, precursor gases trimethyl silane (3MS) and ammonia ($NH_3$) are used in combination with an inert gas, such as helium, to establish a reactive ambient for the deposition of a nitrogen-containing silicon carbide layer. The ratio between trimethyl silane and ammonia substantially determines the amount of nitrogen incorporated into the silicon carbide layer 250. The deposition may take place in any appropriate CVD process tool (not shown), which additionally allows the establishment of a plasma ambient. For example, plasma enhanced CVD deposition systems available from Applied Materials such as DXZ™ or Producer™ may be used. After depositing a first portion of the barrier/etch stop layer 250 with a required nitrogen concentration, for example as indicated by the intermediate thickness 254, the supply of ammonia may be reduced or may be discontinued so as to gradually decrease the amount of nitrogen incorporated into the remaining portion of the barrier/etch stop layer 250. For example, approximately 20–30 nm of silicon carbide including approximately 15–30% or even more nitrogen may be deposited, when the ammonia supply is discontinued, wherein approximately 20–30 nm of silicon carbide are further deposited, while only a reduced amount of nitrogen is incorporated due to residual, steadily dropping nitrogen level in the deposition ambient. When the remaining nitrogen is substantially completely consumed, an extremely low nitrogen concentration is obtained at the end of the deposition process, thereby leading to a very low nitrogen concentration at the first surface 251 or even a substantially nitrogen-free surface 251. As may readily be appreciated, by varying the time of reducing or discontinuing the ammonia supply, a variety of different concentration profiles may be obtained. For example, in some embodiments, it may be advantageous to provide a relatively thin first portion of the layer 250, i.e., the intermediate thickness 254 is approximately 10 nm, so that for the layer 250 having substantially the same thickness as before, an extremely low nitrogen concentration is obtained at the first interface 251, which may be less than approximately 0.1%.

In one typical embodiment, the process parameters may be as follows:

| | |
|---|---|
| Gas flow of 3MS: | Approximately 100–300 sccm |
| Gas flow of ammonia ($NH_3$): | Approximately 200–500 sccm |
| Gas flow of helium: | Approximately 200–600 sccm |
| Temperature of the substrate 201: | Approximately 320–360° C. |
| Pressure of the deposition ambient: | Approximately 2–5 Torr |

After a desired fraction of the target film thickness of the layer 250 is deposited, the ammonia gas flow is discontinued and the deposition is continued until the finally desired thickness is obtained. Typically, with the above process parameters, a silicon carbide film with a total thickness of approximately 40–80 nm and having a varying nitrogen concentration, as is qualitatively represented by curve A in FIG. 2b, may be formed with a deposition time of approximately 10–30 seconds. Typically, the RF power during the deposition may be in the range from approximately 200–400 watts.

In a further embodiment, a helium plasma treatment may be carried out after completion of the deposition in order to densify the first surface 251 of the barrier/etch stop layer 250. In one embodiment, the helium plasma treatment may be carried out at a temperature in the range of approximately 300–400° C. for a duration of approximately 15–60 seconds.

In one particular embodiment, the deposition of the layer 250 with a first portion of increased nitrogen concentration and a second portion with a decreased nitrogen concentration including the helium treatment may be carried out in the same process chamber without breaking the vacuum.

In other embodiments, the barrier/etch stop layer 250 may be deposited to the intermediate thickness 254 and subsequently the deposition may be discontinued, for example, by interrupting the trimethyl silane and the ammonia supply, and a pump and purge step may be carried out to remove the precursor gases. Subsequently, the silicon carbide deposition may be continued with trimethyl silane but without ammonia, so as to obtain a steeper decrease of the nitrogen concentration at the intermediate thickness 254. In this case, the barrier/etch stop layer 250 may be considered as comprising two sub-layers having significantly differing nitrogen concentrations at the first and second surfaces 251 and 252. In other embodiments, the ammonia supply may be gradually reduced or step-wise reduced during the deposition so as to obtain a profile that is more like the profile represented by curve B in FIG. 2b.

Figure 2C:
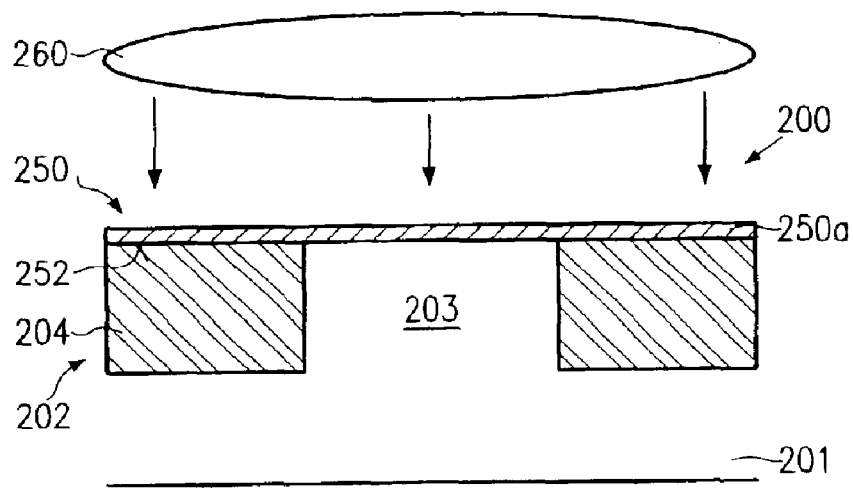
FIGS. 2c and 2d illustrate a barrier/etch stop layer in accordance with still other illustrative embodiments of the present invention.
Figure 2D:
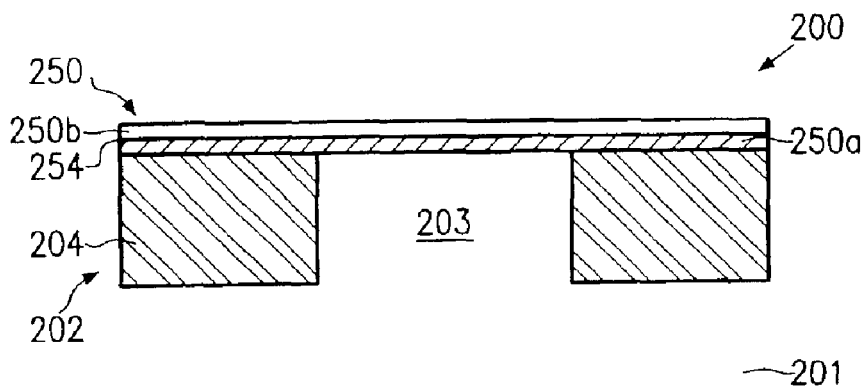
Figure 2E:
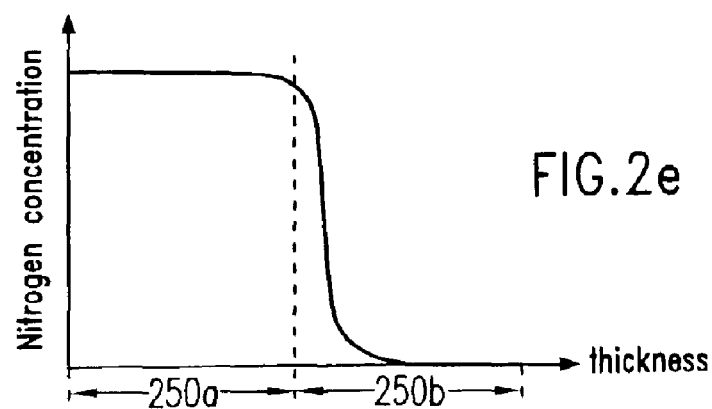
FIGS. 2e–2j depict a semiconductor structure during further process stages, wherein resist poisoning is significantly reduced due to the reduced or even substantially nitrogen-free interface between the barrier/etch stop layer according to the present invention and an overlying low-k dielectric material.

With reference to FIGS. 2c–2e, still further illustrative embodiments of the present invention for forming the barrier/etch stop layer 250 will now be described. In FIG. 2c, a first portion of the barrier/etch stop layer 250, indicated as 250a, has been formed, whereas, contrary to the embodiments as described with reference to FIGS. 2a and 2b, the first portion 250a is deposited as a silicon carbide layer substantially without any nitrogen. During deposition of the first portion 250a, a thickness thereof may be controlled in accordance with design requirements for the barrier/etch stop layer 250. Next, a low power nitrogen plasma ambient 260 is established to incorporate nitrogen into the first portion 250a. For establishing the plasma ambient 260, any appropriate process tool having the ability to generate a plasma ambient may be used. In some embodiments, the same deposition tool used for the plasma-enhanced deposition of the first portion 250a may be employed for generating the nitrogen plasma ambient 260. A relatively low bias voltage may be applied between the plasma ambient 260 and the substrate 202, so that nitrogen ions impinge on the first portion 250a with relatively low kinetic energy, thereby substantially avoiding the penetration of nitrogen into the materials of the first metallization layer 202. Thus, the incorporation of nitrogen into the first portion 250a is caused by a weak implantation and by the interaction of nitrogen radicals with the silicon and carbon in the first portion 250a. For example, by applying a bias voltage in the range of approximately 5–100 volts, the penetration depth of nitrogen, and hence the concentration thereof, may be adjusted to any desired value. In one embodiment, the first portion 250a may be provided with a thickness in the range of 10–20 nm and a concentration of approximately 15–30% or more nitrogen may be incorporated by the nitrogen plasma ambient 260 so as to obtain a thickness of the first portion 250a of the barrier/etch stop layer 250 having the required electromigration and adhesion characteristics in conjunction with the underlying metal region 203. Subsequently, the deposition of silicon carbide may be continued, for example, in the same process chamber or in a different chamber to form the barrier/etch stop layer 250 with the required final thickness. Since the penetration depth of nitrogen as substantially confined to surface portions of the first portion 250a, this embodiment is advantageous when a thin nitrogen-containing layer 250a is to be formed. Otherwise, a plurality of thin sub-layers 250a may be formed in accordance with the above-described process.

FIG. 2d schematically shows the semiconductor structure 200 with the barrier/etch stop layer 250 having a second portion 250b in which a nitrogen concentration is minimal, as the deposition has been carried out substantially without any nitrogen-containing precursor gases. The first portion 250a and the second portion 250b are separated from each other at the intermediate thickness 254 at which the nitrogen concentration rapidly drops from a required high level in the first portion 250a to an extremely low level, for example 0.1% and less, in the second portion 250b. FIG. 2e schematically shows a typical profile of the nitrogen concentration along the depth direction 253.

Figure 2F:
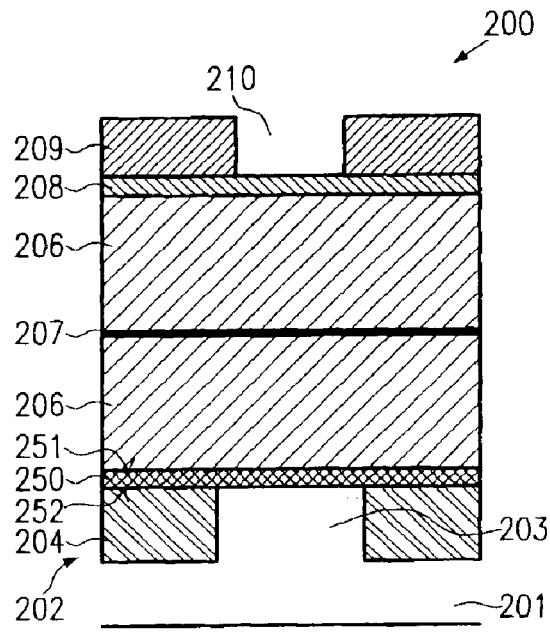

FIG. 2f schematically shows the semiconductor structure 200 in an advanced manufacturing stage similar to that shown in FIG. 1a. Thus, the semiconductor structure 200 comprises a low-k dielectric layer 206 that may be comprised of a first layer and a second layer with an etch stop layer 207, for example formed of silicon carbide, interposed therebetween, whereas, in other embodiments, the etch stop layer 207 is omitted. The low-k dielectric layer 206 is comprised of any appropriate dielectric material, such as silicon oxycarbide, and the like. A cap layer 208 may optionally be formed over the dielectric layer 206 and a resist mask 209 having formed therein an opening 210 is formed over the cap layer 208.

Regarding the formation of the semiconductor structure 200 as shown in FIG. 2f, the same processes may be employed as previously explained with reference to FIG. 1a. It should be noted, however, that, due to the reduced nitrogen concentration at the first surface 251, the diffusion of nitrogen into the overlying low-k dielectric is significantly lower than in the corresponding prior art process flow. Thus, the dielectric layer 206 comprises only a minimum amount of nitrogen and nitrogen compounds.

Figure 2G:
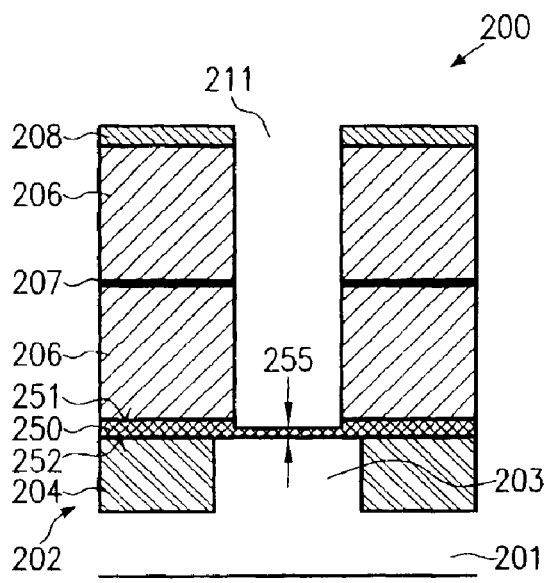

FIG. 2g shows the semiconductor structure 200 after the anisotropic etch procedure for forming a via 211 in the cap layer 208, the dielectric layer 206 and partially in the barrier/etch stop layer 250 so that a thickness 255 remains after the etch process. In one embodiment, the nitrogen concentration in the barrier/etch stop layer 250 is adjusted such that the concentration essentially drops to the desired low value of approximately 1% or less within the remaining thickness 255. In this way, liberation of nitrogen during the etch process or in a subsequent fill process is suppressed. Such a "localized" nitrogen concentration may be obtained by some of the embodiments described with reference to FIGS. 2b–2e. The process flow may be carried out similarly as already described with reference to FIG. 1b.

Figure 2H:
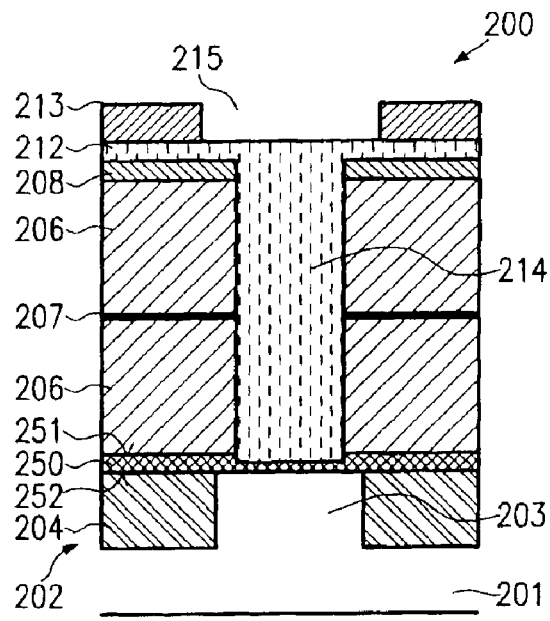

FIG. 2h schematically depicts an advanced manufacturing stage, wherein the via 211 is filled with an organic anti-reflective coating material 214 to form a via plug and a corresponding anti-reflective layer 212 is formed on the dielectric layer 206. A photoresist mask 213 having a trench opening 215 is formed over the anti-reflective layer 212, wherein, as previously noted, the photoresist mask 213 may be comprised of a bi-layer resist.

In forming the structure 200 as shown in FIG. 2h, wherein substantially the same process steps may be involved as already described with reference to FIG. 1c, the small amounts of nitrogen and nitrogen compounds in the dielectric layer 206 diffusing up to the photoresist mask 213 may not be sufficient to cause any resist poisoning. Therefore, the trench opening 215 is substantially completely open and includes only an insignificant amount of resist residuals or is even substantially free of resist residuals.

Figure 2I:
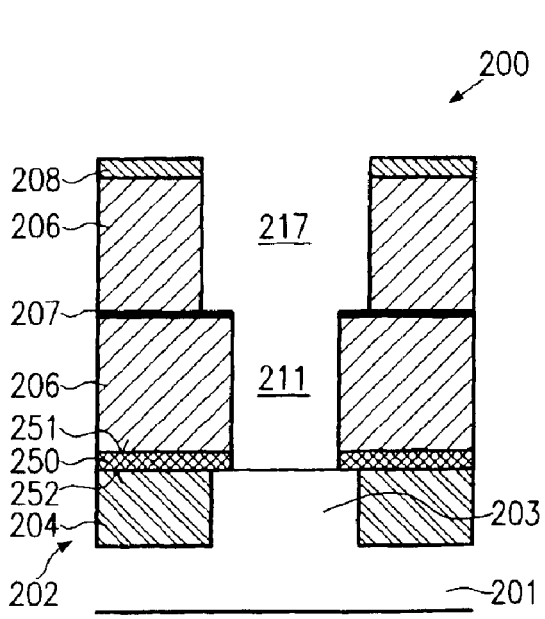

FIG. 2i shows the semiconductor structure 200 after anisotropically etching the upper portion of the dielectric layer 206 to form a trench 217 that substantially corresponds to the dimensions of the trench opening 215 in the photoresist mask 213. Etching the trench 217 and subsequently removing the anti-reflective coating 212 and the residual photoresist 213 may be carried out as already described with reference to FIG. 1d. Moreover, the barrier/etch stop layer 250 may be completely opened to provide a connection to the underlying metal region 203.

Figure 2J:
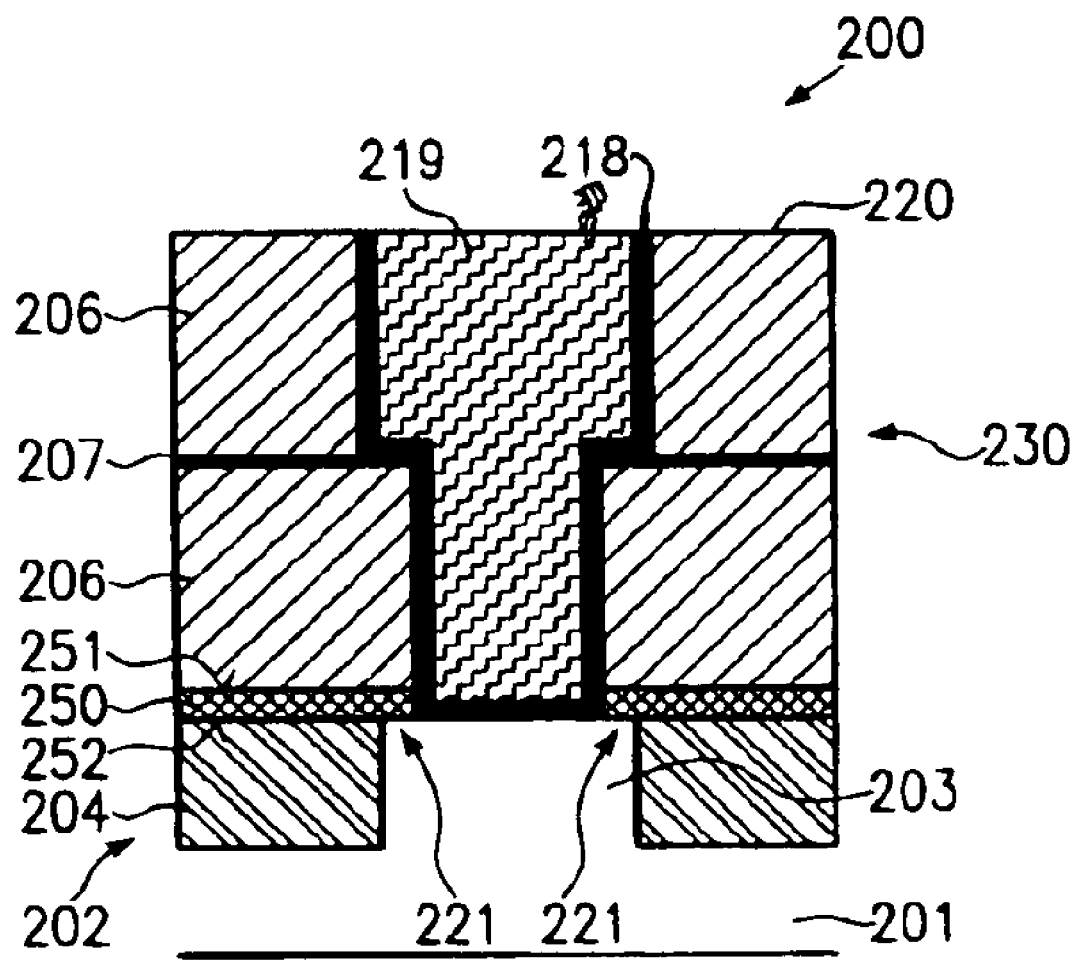

FIG. 2j schematically shows the semiconductor structure 200 with a second metallization layer 230 formed over the first metallization layer 202 and partially separated therefrom by the barrier/etch stop layer 250. Moreover, a barrier metal layer 218 is formed inside the trench opening 217 and the via opening 211, wherein these openings are now filled with copper 219 so that an electrical connection is provided between the first metal region 203 and the trench 217. Moreover, the cap layer 208 is removed so that a substantially planar surface 220 is provided that may receive a further metallization layer, such as the second metallization layer 230.

Regarding the formation of the structure as shown in FIG. 2j, the same criteria apply as already pointed out with reference to FIG. 1d. In particular, interface portions 221 of the barrier/etch stop layer 250 that are in contact with the first metal region 203 exhibit a sufficiently high nitrogen concentration to provide for the required electromigration and adhesion characteristics, whereas, at the opposing first surface 251, a significantly reduced nitrogen concentration is still maintained.

As a result, according to the present invention, metallization layers including low-k dielectric materials and copper may be provided, wherein a significantly reduced nitrogen concentration of a barrier/etch stop layer required at an interface between two adjacent metallization layers ensures a minimal up-diffusion of nitrogen and nitrogen compounds so that resist poisoning may be efficiently reduced. Consequently, the formation of highly-scaled dual damascene metallization layers including copper may be achieved, without unduly decreasing production yield and device reliability.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a metallization layer, the method comprising:
    depositing a single-layer, low-k barrier layer over a substrate having formed thereon a metal region;
    during depositing said single-layer, low-k barrier layer, controlling incorporation of a diffusion barrier component into said single-layer, low-k barrier layer such that a concentration of said diffusion barrier component is highest at a first surface of said single-layer, low-k barrier layer facing said metal region and is lowest at a second surface opposite to said first surface, wherein controlling incorporation of said diffusion barrier component includes depositing a first portion of said single-layer, low-k barrier layer, discontinuing supply of a precursor gas containing said diffusion barrier component and depositing a second portion of said single-layer, low-k barrier layer; and
    depositing a low-k dielectric layer over said single-layer, low-k barrier layer.

2. The method of claim 1, further comprising patterning said low-k dielectric layer by anisotropic etching with a photoresist mask, wherein resist poisoning is reduced due to a reduced diffusion of said diffusion barrier component through the second surface.

3. The method of claim 2, wherein patterning of said low-k dielectric layer includes forming a via extending through said low-k dielectric layer and forming a trench in an upper portion of said low-k dielectric layer by means of a resist mask.

4. The method of claim 3, further comprising forming a barrier metal layer on sidewalls of said via and said trench and filling said via and said trench with copper.

5. The method of claim 3, wherein patterning of said low-k dielectric layer further includes forming an organic anti-reflective coating on said low-k dielectric layer and in said via prior to forming a resist mask for patterning said trench.

6. The method of claim 1, wherein controlling incorporation of said diffusion barrier component includes reducing an amount of a precursor gas containing said diffusion barrier component in a deposition ambient while continuing depositing of said single-layer, low-k barrier layer.

7. The method of claim 1, wherein said diffusion barrier component comprises nitrogen.

8. The method of claim 1, wherein said single-layer, low-k barrier layer comprises silicon carbide.

9. The method of claim 8, wherein said single-layer, low-k barrier layer is deposited from trimethyl silane and ammonia as precursor gases.

10. The method of claim 1, wherein controlling incorporation of said diffusion barrier component includes:
    depositing a first portion of said single-layer, low-k barrier layer in the presence of a precursor gas containing said diffusion barrier component;
    removing said precursor gas containing said diffusion barrier component from a deposition ambient; and
    depositing a second portion of said single-layer, low-k barrier layer substantially without said precursor gas containing said diffusion barrier component.

11. The method of claim 1, wherein said method is performed in a single process chamber without breaking a vacuum established in said process chamber.

12. A method of forming a single-layer, low-k dielectric barrier layer over a metal region in a metallization structure, the method comprising:

depositing a nitrogen-containing silicon carbide layer from silicon, carbon and nitrogen-containing precursor gases over at least said metal region; and discontinuing feeding of said nitrogen-containing precursor gas while further depositing silicon carbide to obtain said single-layer, low-k dielectric barrier layer, wherein a nitrogen concentration in said single-layer, low-k dielectric barrier layer is highest at a first surface of said single-layer, low-k dielectric barrier layer facing said metal region and is lowest at a second surface opposite to said first surface.

13. The method of claim 12, further comprising forming a low-k dielectric layer over said single-layer, low-k dielectric barrier layer, wherein a diffusion of nitrogen and compounds thereof is reduced due to the decreasing nitrogen concentration in said low-k dielectric barrier layer.

14. The method of claim 12, wherein said single-layer, low-k dielectric barrier layer is deposited from trimethyl silane and ammonia as precursor gases.

15. The method of claim 12, wherein a thickness of said low-k dielectric layer prior to discontinuing feeding of said nitrogen-containing precursor gas is in the range of approximately 10–50 nm.

16. The method of claim 12, wherein said method is performed in a single process chamber without breaking a vacuum established in said process chamber.

17. A method of forming a low-k dielectric barrier layer over a metal region in a metallization structure, the method comprising:

depositing a first silicon carbide layer from a silicon and carbon-containing precursor gas on at least said metal region;

after depositing said first silicon carbide layer, introducing a nitrogen precursor gas into a chamber and establishing a low energy nitrogen plasma ambient to introduce nitrogen into said first silicon carbide layer, said first silicon carbide layer having a first concentration of nitrogen;

discontinuing the introduction of said nitrogen precursor gas; and after discontinuing the introduction of said nitrogen presursor gas, depositing a second silicon cardide layer on said first silicon carbide layer, said second silicon carbide layer having a second concentration of nitrogen that is less than said first concentration of nitrogen.

18. The method of claim 17, further comprising controlling said low energy nitrogen plasma ambient by applying a DC bias voltage in the range of approximately 5–100 volts.

19. The method of claim 18, wherein a thickness of said first silicon carbide layer is in the range of approximately 5–10 nm.

20. The method of claim 18, wherein said method is carried out without breaking a vacuum prevailing during depositing the first and the second silicon carbide layers and establishing said nitrogen plasma ambient.

21. The method of claim 17, wherein a plurality of first silicon carbide layers are deposited and nitrogen is incorporated into each of said plurality of first silicon carbide layers prior to depositing a subsequent second silicon carbide layer.

22. A method of forming a single-layer, low-k barrier layer over a metal region in a metallization structure, the method comprising:

depositing a first portion of said single-layer, low-k barrier layer above said metal region while supplying a nitrogen-containing precursor gas, said first portion having a first concentration of nitrogen;

discontinuing supply of said nitrogen-containing precursor gas;

after discontinuing supply of said nitrogen-containing precursor gas, depositing a second portion of said single-layer, low-k barrier layer above said first portion of said single-layer, low-k barrier layer, said second portion having a second concentration of nitrogen, wherein said second concentration of nitrogen is less than said first concentration of nitrogen; and depositing a dielectric layer above said second portion of said single-layer, low-k barrier layer.

23. The method of claim 22, wherein said first and second portions of said single-layer, low-k barrier layer are comprised of silicon carbide.

24. The method of claim 22, wherein said method is preformed in a single process chamber without breaking a vacuum established in said process chamber.

25. A method of forming a single-layer barrier layer comprised of first and second portions of silicon carbide over a metal region in a metallization structure, the method comprising:

depositing a first portion of silicon carbide on said metal region while supplying a nitrogen-containing precursor gas, said first portion of silicon carbide having a first concentration of nitrogen;

discontinuing supply of said nitrogen-containing precursor gas;

after discontinuing supply of said nitrogen-containing precursor gas, depositing a second portion of silicon carbide on said first portion of silicon carbide, said second portion of silicon carbide having a second concentration of nitrogen, wherein said second concentration of nitrogen is less than said first concentration of nitrogen; and depositing a dielectric layer on said second portion of silicon carbide.

26. The method of claim 25, wherein said nitrogen concentration of said first portion of silicon carbide is higher at a surface that interfaces with said metal region.

27. The method of claim 25, wherein said method is performed in a single process chamber without breaking a vacuum established in said process chamber.

28. A method of forming a metallization layer, the method comprising:

depositing a single-layer, low-k barrier layer over a substrate having formed thereon a metal region;

during depositing said single-layer, low-k barrier layer, controlling incorporation of a diffusion barrier component into said low-k barrier layer such that a concentration of said diffusion barrier component is highest at a first surface of said single-layer, low-k barrier layer facing said metal region and is lowest at a second surface opposite to said first surface;

depositing a low-k dielectric layer over said single-layer, low-k barrier layer; and patterning said low-k dielectric layer by anisotropic etching with a photoresist mask, wherein resist poisoning is reduced due to a reduced diffusion of said diffusion barrier component through the second surface, wherein patterning of said low-k dielectric layer includes forming a via extending through said low-k dielectric layer and forming a trench in an upper portion of said low-k dielectric layer by means of a resist mask.

29. The method of claim 28, wherein controlling incorporation of said diffusion barrier component includes reducing an amount of a precursor gas containing said diffusion barrier component in a deposition ambient while continuing depositing of said single-layer, low-k barrier layer.

30. The method of claim 28, wherein controlling incorporation of said diffusion barrier component includes depositing a first portion of said single layer, low-k barrier layer, discontinuing supply of a precursor gas containing said diffusion barrier component and depositing a second portion of said single-layer, low-k barrier layer.

31. The method of claim 28, wherein said diffusion barrier component comprises nitrogen.

32. The method of claim 28, further comprising forming a barrier metal layer on sidewalls of said via and said trench and filling said via and said trench with copper.

33. The method of claim 28, wherein patterning of said low-k dielectric layer further includes forming an organic anti-reflective coating on said low-k dielectric layer and in said via prior to forming a resist mask for patterning said trench.

34. The method of claim 28, wherein said method is performed in a single process chamber without breaking a vacuum established in said process chamber.

35. A method of forming a metallization layer, the method comprising:

depositing a single-layer, low-k barrier layer over a substrate having formed thereon a metal region;

during depositing said single-layer, low-k barrier layer, controlling incorporation of a diffusion barrier component into said single-layer, low-k barrier layer such that a concentration of said diffusion barrier component is highest at a first surface of said single-layer, low-k barrier layer facing said metal region and is lowest at a second surface opposite to said first surface, wherein controlling incorporation of said diffusion barrier component includes:

depositing a first portion of said single-layer, low-k barrier layer in the presence of a precursor gas containing said diffusion barrier component;

removing said precursor gas containing said diffusion barrier component from a deposition ambient; and depositing a second portion of said single-layer, low-k barrier layer substantially without said precursor gas containing said diffusion barrier component; and depositing a low-k dielectric layer over said single-layer, low-k barrier layer.

36. The method of claim 35, further comprising patterning said low-k dielectric layer by anisotropic etching with a photoresist mask, wherein resist poisoning is reduced due to a reduced diffusion of said diffusion barrier component through the second surface.

37. The method of claim 36, wherein patterning of said low-k dielectric layer includes forming a via extending through said low-k dielectric layer and forming a trench in an upper portion of said low-k dielectric layer by means of a resist mask.

38. The method of claim 37, wherein patterning of said low-k dielectric layer further includes forming an organic anti-reflective coating on said low-k dielectric layer and in said via prior to forming a resist mask for patterning said trench.

39. The method of claim 35, wherein said diffusion barrier component comprises nitrogen.

40. The method of claim 35, wherein said single-layer, low-k barrier layer comprises silicon carbide.

41. The method of claim 35, wherein said method is performed in a single process chamber without breaking a vacuum established in said process chamber.

* * * * *

UNITED STATES PATENT AND TRADEMARK OFFICE
CERTIFICATE OF CORRECTION

PATENT NO. : 6,893,956 B2
DATED : May 17, 2005
INVENTOR(S) : Hartmut Ruelke et al.

It is certified that error appears in the above-identified patent and that said Letters Patent is hereby corrected as shown below:

Column 13,
Line 42, change "presursor" to -- precursor --.
Line 42, change "cardide" to -- carbide --.

Column 14,
Line 16, change "preformed" to -- performed --.

Signed and Sealed this

Twenty-third Day of August, 2005

JON W. DUDAS
*Director of the United States Patent and Trademark Office*